United States Patent [19]

Lee

[11] Patent Number: 4,902,607

[45] Date of Patent: Feb. 20, 1990

[54] METAL-ETCHING PROCESS

[75] Inventor: Sai K. Lee, Sepulveda, Calif.

[73] Assignee: American Etching & Manufacturing, Pacoima, Calif.

[21] Appl. No.: 47,150

[22] Filed: May 6, 1987

[51] Int. Cl.⁴ .............................................. G03C 5/00
[52] U.S. Cl. ..................................... 430/323; 430/314;
430/324; 430/325; 430/327; 430/329; 430/330;
156/644; 156/659.1; 156/664; 204/18.1;
204/23; 204/32.1; 427/126.6
[58] Field of Search ............... 430/323, 324, 325, 330,
430/329, 314, 316, 318, 319, 327; 204/15, 18.1,
23, 34, 32.1; 156/664, 666; 427/61, 96, 98, 123,
126.1, 126.6

[56] References Cited

U.S. PATENT DOCUMENTS

| | | | |
|---|---|---|---|
| 2,443,119 | 6/1948 | Rubin | 430/324 |
| 2,829,460 | 4/1958 | Golay | 430/323 |
| 3,666,549 | 5/1972 | Rhodenizer et al. | 430/314 |
| 3,672,925 | 6/1972 | Feldstein | 430/324 |
| 3,767,398 | 10/1973 | Morgan | 430/314 |
| 3,833,375 | 9/1974 | Moscony et al. | 430/324 |
| 3,878,007 | 4/1975 | Feldstein et al. | 430/324 |
| 4,297,436 | 10/1981 | Kubotera et al. | 430/323 |
| 4,320,191 | 3/1982 | Yoshikawa et al. | 430/323 |
| 4,368,245 | 1/1983 | Bayer | 430/314 |
| 4,640,739 | 2/1987 | Modic et al. | 156/666 |
| 4,655,884 | 4/1987 | Hills et al. | 204/23.1 |

Primary Examiner—Jose G. Dees
Assistant Examiner—Donald J. Loney
Attorney, Agent, or Firm—Lyon & Lyon

[57] ABSTRACT

An improved metal etching process including preparation of a metal substrate, developing a photoresist on the substrate, coating the exposed substrate with electroless phosphorous nickel alloy, removing the developed photoresist and etching the then exposed substrate. The preparation for depositing the electroless nickel includes washing the surface of the substrate with a very dilute acidic ferric chloride solution, immersing the substrate in a hydrochloric acid solution, and applying a thin metal layer by electrolytic plating, seriatim.

22 Claims, 1 Drawing Sheet

METAL-ETCHING PROCESS

BACKGROUND OF THE INVENTION

The field of the present invention is precise metal etching.

Thin gauge precision metal parts have been produced by photochemical fabrication processes. One such process consists of coating a clean metal sheet with a layer of photosensitive resistive material, then covering it with a photomask. The photomask defines covered areas and exposed areas to achieve a pattern of the final product. The material directly under the photomask remains solvent dissolvable after ultraviolet radiation is applied over the mask. The photoresist layer under the clear area of the photomask is hardened when the workpiece is exposed to ultraviolet radiation. The hardened photoresist covers the desired portion of the metal work piece and forms a chemically-resistant etch mask, leaving the unwanted portion to the attack of an etchant, such as a chromic acid solution or ferric chloride. After chemical etching, the hardened photoresist can be removed by a hot organic stripper. This method has its limitations. For example, it cannot produce a clearly defined, straight, sharp and narrow slit of 0.001 inches in a 0.01 inch thick metal sheet.

Another method, generally referred to as the bi-metal method is capable of greater accuracy. In this process, a temporary photoresist etch mask is replaced by a permanent etch mask such as nickel, gold or silver. In the aforementioned process, the photomask is a negative. In this process, the photomask is a positive of the product resulting from the final etch. The photoresist is covered by an appropriate mask and subjected to ultraviolet radiation. Once the exposed portions of the photoresist are hardened, a solvent is employed to develop the photoresist by washing away the unexposed portions covered by the mask during ultraviolet radiation. The photoresist thus covers the portions to be etched away in the final process. The exposed metal is then electroplated with the permanent mask. Once the permanent mask has been deposited, the hardened photoresist is washed away by hot organic strippers. A chemical etch is then used which does not etch the permanent mask but etches the now-exposed areas of the substrate previously covered by the hardened photoresist. In this process, electroplated nickel and beryllium-copper alloy is typically employed. The etchants used are ammonium hydroxide and cupric chloride or chromium trioxide and sulfuric acid. A difficulty with the bi-metal process is the expensive and limited types of materials which may be used for the process and to make up the substrate.

SUMMARY OF THE INVENTION

An improved metal etching process is the subject of this invention. The process consists of developing a photoresist on a substrate, plating the exposed substrate with an etchant resistant electroless nickel and etching the substrate not covered by the electroless nickel plating. One means by which electroless nickel may achieve etchant resistance is by employing a phosphorous rich nickel bath. Through such a practice, ferric chloride may be used which is capable of etching a variety of metals.

The process constitutes an improvement over the old step of electrolytically depositing a thick layer of nickel alloy onto a substrate. The improved method has the advantage of utilizing an inexpensive and highly corrosion resistant protective coating. The process enables less expensive material to be used as a substrate such as stainless steel and other iron alloys with or without magnetic properties. The process allows for a uniform deposition of material. In electroforming methods, the corners and edges of the substrate tend to receive heavier metal distribution due to nonuniform current densities. Also, the process allows for extremely fine and precise etching to be performed on the surface of the substrate.

Accordingly, it is an object of the present invention to provide an improved etching process. Other and further objects and advantages will appear hereinafter.

DETAILED DESCRIPTION OF THE PREFERRED EMBODIMENT

Figure 1:
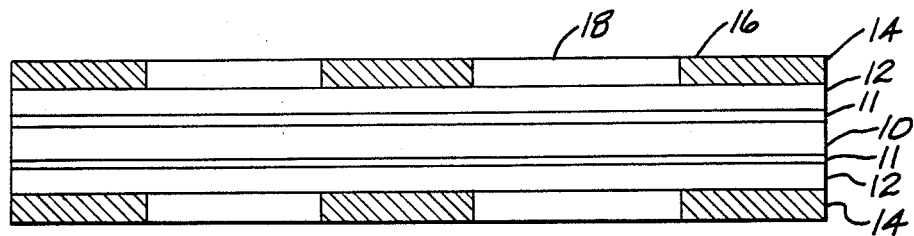
FIG. 1 is a side view of a photoresist coated metal substrate with a photomask prior to exposure to ultraviolet radiation.

Turning in detail to the Figures, an improved process as one embodiment of the present invention is comprised in the following sequence of steps.

(1) A substrate, metal sheet 10, is scrubbed with pumice or other gritty cleaner. The metal 10 can be made of a material such as stainless steel 301, 302, 304, or 316; a steel alloy; or a nickel-iron alloy such as Kovar. Also, copper alloy such as brass or berylium-copper can be used as a metal substrate. Many sheet metal materials are acceptable for use as the substrate. After the metal substrate has been scrubbed, it is rinsed.

(2) A thin layer of electrolytic nickel 11 in a Wood's nickel chloride bath at 60 amperes per square foot is then applied or plated onto to the scrubbed metal surface. The application is to be for approximately two minutes followed by a rinse.

(3) The nickel plated and coated substrate is subsequently immersed in a 25% by volume solution of phosphoric acid at a 140° Fahrenheit for three minutes.

(4) The nickel plated and coated substrate is then dried and a photoresist layer 12 applied. The photoresist layer may be "Waycoat 450" a trademarked product of Hunt Chemical. Other materials are available. It is preferable that the material is polymerized by ultraviolet light. The photoresist is normally applied as a liquid. The coating is then baked to solidify the photoresist on the surface of the substrate.

(5) A photomask 14 is then applied on top of the photoresist layer. The photomask 14 is a transparency, the darkened areas 16 thereof containing an emulsion and the clear areas 18 thereof not containing an emulsion. The surface of the substrate to be etched is beneath the clear area of the transparency while the darkened area masks ultraviolet radiation from the photoresist. See FIG. 1.

(6) With the photomask in place, the photoresist is exposed to ultraviolet radiation. After the coated substrate 10 has been exposed to ultraviolet light, the exposed, hardened photoresist 12 forms a temporary mask covering the unwanted portion of the substrate, the unwanted portion of the substrate being that portion that will be etched away. The desired portion of the substrate 10 is left under unpolymerized or unhardened photoresist 12 and subject to be dissolved by solvents.

Figure 2:
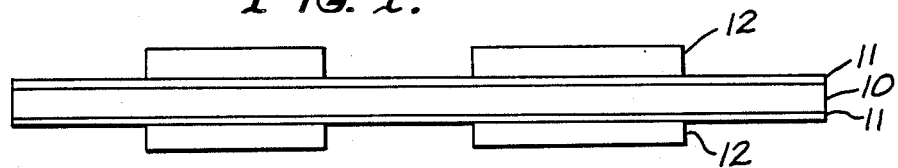
FIG. 2 is a side view of the substrate after it has been exposed to ultraviolet radiation and developed.

(7) After exposure to ultraviolet radiation, the coated substrate 10 is then developed. Developing occurs in a solvent such as 1-1-1 trichloroethane. Particular solvents are typically recommended for particular photoresists. See FIG. 2.

(8) After developing, the substrate 10 is then baked at 80° Centigrade for ten minutes to add durability to the remaining developed photoresist for further processing.

(9) After the substrate is baked it is immersed in a solution of 50% hydrochloric acid for approximately 30 seconds. After immersion the coated substrate should then be rinsed.

(10) The substrate is further reactivated with a very dilute acidic ferric chloride solution. An appropriate solution consists of 5% hydrochloric acid and 4% ferric chloride. The coated substrate should then be rinsed.

(11) A thin layer 19 of electrolytic nickel is then applied to the nickel plated surface of the substrate which has been exposed by the selective removal of the photoresist coating in steps 7-10 above. This second thin layer 19 of electrolytic nickel is applied in a Wood's nickel chloride bath at 60 ampere per square foot for one minute. Some thin coating is preferred for proper adherence of the electroless nickel coating to follow. The Wood's nickel chloride bath is convenient as it may serve for both steps (2) and (11).

Figure 3:
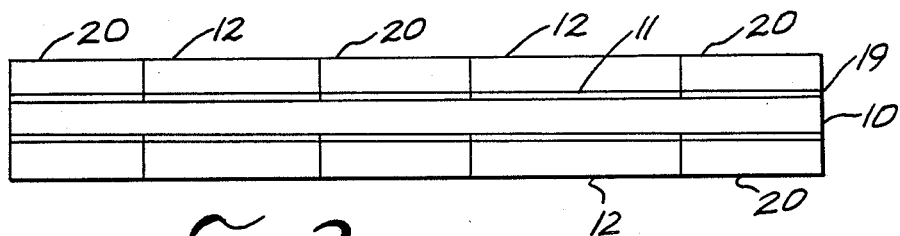
FIG. 3 is a side view of the coated substrate after it has been developed and then had a nickel layer applied to it.

(12) The coated substrate 10 is then plated in an electroless nickel bath at 80° to 90° Centigrade to the desired thickness. The nickel coating 20 preferably consists of 88 to 90% nickel and 10 to 12% phosphorous, with a preferred minimum of 10% phosphorous. If substantially less than 10% phosphorous is used under the circumstances described above, the later use of ferric chloride will tend to etch the nickel. Phosphorous rich electroless nickel baths are commercially available. FIG. 3 is representative of the substrate 10 after this step.

Figure 4:
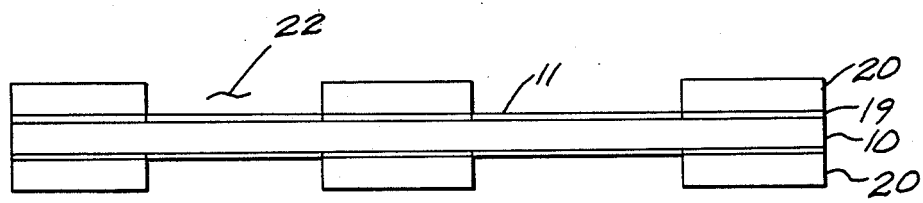
FIG. 4 is a side view of the substrate after the hardened photoresist is removed by hot organic stripper.

(13) The hardened photoresist 12 should then be stripped using a commonly available photoresist stripper. The voids 22 left by the stripped photoresist are shown in FIG. 4.

Figure 5:
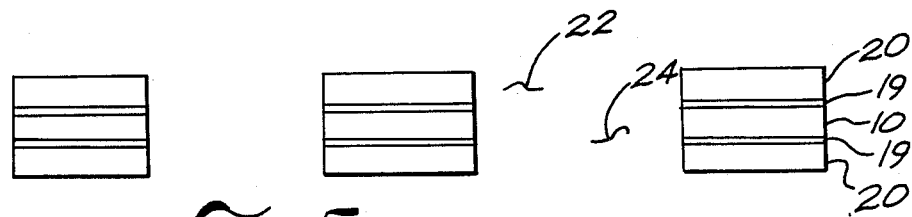
FIG. 5 is a side view of the substrate after etching.

(14) The substrate can then be etched in an acidic ferric chloride solution. The ferric chloride solution may be 45% by weight ferric chloride. The substrate can be etched in a commercially available etching machine. FIG. 5 shows that the exposed metal surface in FIG. 4 is etched away at 24 by the ferric chloride solution.

At the present time the bi-metal etched components (encoder disks, optical targets, etc.) available in the market consist of two components, i.e., electroplated nickel and beryllium-copper alloy. By the present invention, other and less expensive materials may be used. Thus, an improved etching process is disclosed for precise working of metals. It is intended that the above illustration of the invention is by way of example only and not intended to limit the invention in any way except in the spirit of the appended claims.

What is claimed is:

1. A method of etching portions of a metallic substrate, comprising the steps of
   plating a first thin layer of metal onto the substrate;
   coating the portions of the plated substrate to be etched with a temporary mask;
   applying a second thin layer of metal onto the uncoated portions of the once plated and coated substrate and plating over this second layer with a third layer comprising phosphorous rich electroless nickel;
   stripping the temporary mask; and
   etching through the portions of the plated substrate uncovered by removal of the temporary mask sufficiently to etch through the substrate.

2. The method of claim 1 wherein said electroless nickel used to plate the substrate is comprised of nickel and a minimum of about ten percent phosphorous by weight.

3. The method of claim 1 wherein said step of etching includes etching with an acidic ferric chloride solution.

4. The method of claim 3 wherein said ferric chloride solution is substantially about 45% by weight.

5. The method of claim 3 wherein the substrate is selected from the group consisting of metals and alloys which can be etched by ferric chloride.

6. The method of claim 1 wherein the substrate is selected from a group consisting of stainless steel; copper alloys such as brass or beryllium-copper; nickel alloys; and nickel-iron alloys.

7. The method of claim 1
   wherein said first thin layer of metal is electroless nickel.

8. The method of claim 7 wherein the step of preparing the substrate further includes washing the substrate in a solution of hydrochloric acid before said step of applying said thin layer.

9. The method of claim 8 wherein the hydrochloric acid solution is 50% HCl.

10. The method of claim 9 wherein the coated substrate is immersed for thirty seconds.

11. The method of claim 7 wherein the step of preparing the substrate further includes washing the substrate in a very dilute acidic ferric chloride soluton before said step of applying said thin second layer.

12. The method of claim 11 wherein the ferric chloride solution is comprised of about 5% HCl and 4% FeCl$_3$.

13. The method of claim 1 wherein the step of preparing the substrate further includes washing the substrate in hydrochloric acid and then washing the substrate in a very dilute acidic ferric chloride solution after developing the substrate and before applying said second thin layer.

14. A method for etching portions of a metallic substrate, comprising in sequence the steps of:
   applying a first thin layer of electrolytic nickel to the substrate;
   applying a thin coating of photoresist material on the first thin layer of electrolytic nickel on the substrate;
   applying a photomask over the coated substrate, leaving a portion of the coated substrate exposed to radiation penetrating through the photomask;
   hardening the unmasked photoresist material by radiation;
   developing the photoresist material;

applying a second thin layer of electrolytic nickel to the first thin layer of electrolytic nickel exposed on the substrate;

plating the second thin layer with phosphorous rich electroless nickel;

stripping the developed photoresist material; and etching the portion of the plated substrate uncovered by removal of the photoresist material sufficiently to etch through the substrate.

15. The method of claim 14 further comprising the step of preparing the substgrate for coating by immersing the substrate in a solution of phosphoric acid.

16. The method of claim 14 wherein the step of hardening the photoresist material includes polymerizing the unmasked photoresist material by exposing said photoresist material to ultraviolet light.

17. The method of claim 14 wherein the step of developing the photoresist material includes washing off the unpolymerized photoresist material with a solvent therefor.

18. The method of claim 14 further comprising the step of baking the coated substrate after developing the unpolymerized photoresist.

19. The method of claim 18 wherein the step of baking occurs at about 80° C. for 10 minutes.

20. The method of claim 14 further comprising the steps of immersing the coated substrate in a hydrochloric acid solution after developing; and rinsing the acid solution off.

21. The method of claim 14 further comprising the steps of reactivating the surface of the substrate using a ferric chloride solution after developing the photoresist material; and rinsing said ferric chloride solution from the substrate.

22. The method of claim 14 further comprising the steps of immersing the coated substrate in a hydrocholoric acid solution after developing;

rinsing the acid solution off;

reactivating the surface of the substrate using a ferric chloride solution after developing; and rinsing said ferric chloride solution from the substrate.

* * * * *